(12) United States Patent
Nam et al.

(10) Patent No.: US 9,870,825 B2
(45) Date of Patent: Jan. 16, 2018

(54) NONVOLATILE MEMORY DEVICE AND METHOD OF PROGRAMMING THE SAME

(71) Applicants: Sang-Wan Nam, Hwaseong-si (KR); Wandong Kim, Seoul (KR)

(72) Inventors: Sang-Wan Nam, Hwaseong-si (KR); Wandong Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 91 days.

(21) Appl. No.: 14/733,239

(22) Filed: Jun. 8, 2015

(65) Prior Publication Data

US 2016/0064083 A1 Mar. 3, 2016

(30) Foreign Application Priority Data

Sep. 2, 2014 (KR) .................. 10-2014-0116401

(51) Int. Cl.
| | | |
|---|---|---|
| *G11C 16/10* | (2006.01) | |
| *G11C 16/24* | (2006.01) | |
| *G11C 16/08* | (2006.01) | |
| *G11C 16/04* | (2006.01) | |
| *G11C 11/56* | (2006.01) | |

(52) U.S. Cl.
CPC .......... *G11C 16/10* (2013.01); *G11C 11/5628* (2013.01); *G11C 16/0483* (2013.01); *G11C 16/24* (2013.01); *G11C 16/08* (2013.01)

(58) Field of Classification Search
CPC . G11C 16/10; G11C 11/5628; G11C 16/0483; G11C 16/24; G11C 16/08
USPC .................................................. 365/185.11
See application file for complete search history.

(56) References Cited

U.S. PATENT DOCUMENTS

| | | | |
|---|---|---|---|
| 6,614,688 B2 | 9/2003 | Jeong et al. | |
| 7,463,531 B2 | 12/2008 | Hemink et al. | |
| 7,468,918 B2 | 12/2008 | Dong et al. | |
| 7,679,133 B2 | 3/2010 | Son et al. | |
| 7,859,902 B2* | 12/2010 | Maejima | G11C 5/02 365/185.05 |
| 8,027,202 B2* | 9/2011 | Lee | G11C 16/0483 365/185.03 |
| 8,085,601 B2* | 12/2011 | Kim | G11C 11/5628 365/185.25 |
| 8,174,891 B2 | 5/2012 | Hosono | |
| 8,213,233 B2* | 7/2012 | Sarin | G11C 11/5628 365/185.17 |
| 8,385,115 B2 | 2/2013 | Lee et al. | |

(Continued)

FOREIGN PATENT DOCUMENTS

| | | |
|---|---|---|
| KR | 10-0157346 B1 | 7/1998 |
| KR | 10-2012-0043514 A | 5/2012 |

*Primary Examiner* — Anthan Tran
*Assistant Examiner* — Mushfique Siddique
(74) *Attorney, Agent, or Firm* — Volentine & Whitt, PLLC

(57) ABSTRACT

A nonvolatile memory device includes a memory cell array, an address decoder, a read & write circuit and control logic. The memory cell array includes a plurality of memory blocks including a plurality of cell strings, each cell string including a plurality of memory cells stacked in a direction perpendicular to a substrate. The control logic controls operations so that in a program operation, when the selected word line satisfies a precharge condition, a program voltage to be applied to the selected word line is applied before a pass voltage to be applied to an unselected word line.

13 Claims, 15 Drawing Sheets

(56) References Cited

U.S. PATENT DOCUMENTS

| | | | | |
|---|---|---|---|---|
| 8,427,878 B2* | 4/2013 | Shim | | G11C 16/0483 365/185.17 |
| 8,488,402 B2* | 7/2013 | Shim | | G11C 7/12 365/185.11 |
| 8,493,789 B2 | 7/2013 | Yoon et al. | | |
| 8,553,466 B2 | 10/2013 | Han et al. | | |
| 8,559,235 B2 | 10/2013 | Yoon et al. | | |
| 8,570,805 B2* | 10/2013 | Lee | | G11C 16/0483 365/185.17 |
| 8,654,587 B2 | 2/2014 | Yoon et al. | | |
| 8,854,890 B1* | 10/2014 | Miwa | | G11C 16/0483 365/185.02 |
| 8,964,476 B2* | 2/2015 | Shim | | G11C 16/0483 365/185.17 |
| 9,053,794 B2* | 6/2015 | Kwak | | H01L 27/1157 |
| 9,064,581 B2* | 6/2015 | Kim | | G11C 11/5628 |
| 9,093,157 B2* | 7/2015 | Kwak | | G11C 8/08 |
| 9,312,008 B2* | 4/2016 | Nam | | G11C 16/0483 |
| 9,318,202 B2* | 4/2016 | Nam | | G11C 16/0483 |
| 9,349,471 B2* | 5/2016 | Yun | | G11C 16/3431 |
| 9,424,947 B2* | 8/2016 | Kwak | | G11C 16/10 |
| 9,460,793 B1* | 10/2016 | Oh | | G11C 16/08 |
| 9,460,805 B1* | 10/2016 | Pang | | G11C 16/0483 |
| 9,514,828 B2* | 12/2016 | Shim | | G11C 16/24 |
| 9,620,219 B2* | 4/2017 | Kim | | G11C 16/10 |
| 9,659,656 B2* | 5/2017 | Nguyen | | G11C 16/0483 |
| 2005/0270882 A1* | 12/2005 | Han | | G11C 16/12 365/227 |
| 2007/0140013 A1* | 6/2007 | Kwon | | G11C 16/0483 365/185.17 |
| 2008/0158991 A1* | 7/2008 | Hemink | | G11C 11/5628 365/185.22 |
| 2008/0159004 A1* | 7/2008 | Hemink | | G11C 11/5628 365/185.25 |
| 2010/0027332 A1* | 2/2010 | Lee | | G11C 16/0483 365/185.03 |
| 2010/0027337 A1* | 2/2010 | Park | | G11C 5/147 365/185.11 |
| 2010/0054036 A1* | 3/2010 | Lee | | G11C 16/0483 365/185.03 |
| 2010/0067305 A1* | 3/2010 | Park | | G11C 16/12 365/185.19 |
| 2011/0051520 A1* | 3/2011 | Kim | | G11C 11/5628 365/185.19 |
| 2011/0090744 A1* | 4/2011 | Cho | | G11C 16/0483 365/185.25 |
| 2011/0157995 A1* | 6/2011 | Bicksler | | G11C 16/10 365/185.19 |
| 2011/0199833 A1* | 8/2011 | Shim | | G11C 16/0483 365/185.23 |
| 2011/0233648 A1 | 9/2011 | Seol et al. | | |
| 2011/0238913 A1* | 9/2011 | Kurashige | | G06F 3/0605 711/114 |
| 2012/0081962 A1* | 4/2012 | Tsai | | G11C 16/0483 365/185.15 |
| 2012/0099387 A1* | 4/2012 | Shim | | G11C 7/12 365/189.05 |
| 2013/0100737 A1* | 4/2013 | Kwak | | H01L 27/1157 365/185.11 |
| 2013/0107629 A1* | 5/2013 | Shim | | G11C 16/30 365/185.17 |
| 2013/0235667 A1* | 9/2013 | Nam | | G11C 16/10 365/185.17 |
| 2013/0242667 A1* | 9/2013 | Shim | | G11C 16/0483 365/185.19 |
| 2014/0029344 A1* | 1/2014 | Lee | | G11C 16/0483 365/185.17 |
| 2014/0301146 A1* | 10/2014 | Kaza | | G11C 16/08 365/185.23 |
| 2014/0347937 A1* | 11/2014 | Lee | | G11C 16/0483 365/185.19 |
| 2015/0036426 A1* | 2/2015 | Kwak | | G11C 16/10 365/185.03 |
| 2015/0063037 A1* | 3/2015 | Lee | | G11C 16/10 365/185.24 |
| 2015/0117118 A1* | 4/2015 | Shim | | G11C 16/0483 365/185.29 |
| 2015/0221373 A1* | 8/2015 | Nam | | G11C 16/0483 365/185.02 |
| 2015/0318045 A1* | 11/2015 | Yun | | G11C 16/3431 365/185.05 |
| 2015/0332773 A1* | 11/2015 | Kwak | | G11C 16/10 365/185.11 |
| 2016/0055911 A1* | 2/2016 | Nguyen | | G11C 16/10 365/185.17 |
| 2016/0111160 A1* | 4/2016 | Pan | | G11C 16/0483 365/185.11 |
| 2016/0141045 A1* | 5/2016 | Shim | | G11C 16/24 365/185.11 |
| 2016/0141301 A1* | 5/2016 | Mokhlesi | | H01L 27/11573 365/185.22 |
| 2016/0148691 A1* | 5/2016 | Rabkin | | G11C 16/10 365/185.19 |
| 2016/0211027 A1* | 7/2016 | Kim | | G11C 16/10 |
| 2016/0225454 A1* | 8/2016 | Kim | | G11C 16/10 |
| 2016/0247578 A1* | 8/2016 | Yun | | G11C 16/3431 |
| 2016/0260489 A1* | 9/2016 | Lee | | G11C 16/16 |
| 2016/0276034 A1* | 9/2016 | Maejima | | G11C 16/10 |
| 2017/0076803 A1* | 3/2017 | Lee | | G11C 16/14 |
| 2017/0076815 A1* | 3/2017 | Suzuki | | G11C 16/3459 |
| 2017/0186489 A1* | 6/2017 | Kim | | G11C 16/10 |

\* cited by examiner

NONVOLATILE MEMORY DEVICE AND METHOD OF PROGRAMMING THE SAME

CROSS-REFERENCE TO RELATED APPLICATIONS

This U.S. non-provisional patent application claims priority under 35 U.S.C. §119 of Korean Patent Application No. 10-2014-0116401, filed on Sep. 2, 2014, the entire contents of which are hereby incorporated by reference.

FIELD

The inventive concept relates to a memory device and a method of programming the same, and more particularly, to a nonvolatile memory device and a method of programming the same.

BACKGROUND

A semiconductor memory device is a memory device which is embodied using semiconductor such as silicon Si, germanium Ge, gallium arsenide GaAs, indium phosphide InP, etc. A semiconductor memory device is classified into a volatile semiconductor memory device and a nonvolatile semiconductor memory device.

A volatile memory device loses its stored data when its power supply is interrupted. Examples of a volatile memory device include a static RAM (SRAM), a dynamic RAM (DRAM), a synchronous DRAM (SDRAM), etc. A nonvolatile memory device retains its stored data even when its power supply is interrupted. Examples of a nonvolatile memory device include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc. A flash memory is classified into a NOR type flash memory and a NAND type flash memory.

To improve the integration of a semiconductor memory, a three-dimensional semiconductor memory device having a three-dimensional structure is being studied. The three-dimensional semiconductor memory device has a different structural feature from an existing two-dimensional semiconductor memory device. Due to the structural difference between the three-dimensional semiconductor memory device and the two-dimensional semiconductor memory device, various driving methods for driving the three-dimensional semiconductor memory device are being studied.

SUMMARY

Embodiments of the inventive concept provide a program method of a nonvolatile memory device including a plurality of memory blocks including a plurality of cell strings, each string including a plurality of memory cells stacked in a direction perpendicular to a substrate. The program method may include determining whether a selected word line satisfies a precharge condition, and applying a program voltage to be applied to the selected word line before a pass voltage to be applied to an unselected word line when the selected word line satisfies the precharge condition.

Embodiments of the inventive concept also provide a nonvolatile memory device. The nonvolatile memory device may include a memory cell array comprising a plurality of memory blocks including a plurality of cell strings, each cell string including a plurality of memory cells stacked in a direction perpendicular to a substrate and coupled to word lines. An address decoder selects any one of the memory blocks in response to an address, and a read & write circuit is for storing data to be programmed in memory cells connected to a selected word line among word lines of the selected memory block in a program operation. A control logic is configured to control operations so that a program voltage to be applied to the selected word line is applied before a pass voltage to be applied to an unselected word line when the selected word line satisfies a precharge condition in the program operation.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF PREFERRED EMBODIMENTS

Figure 1:
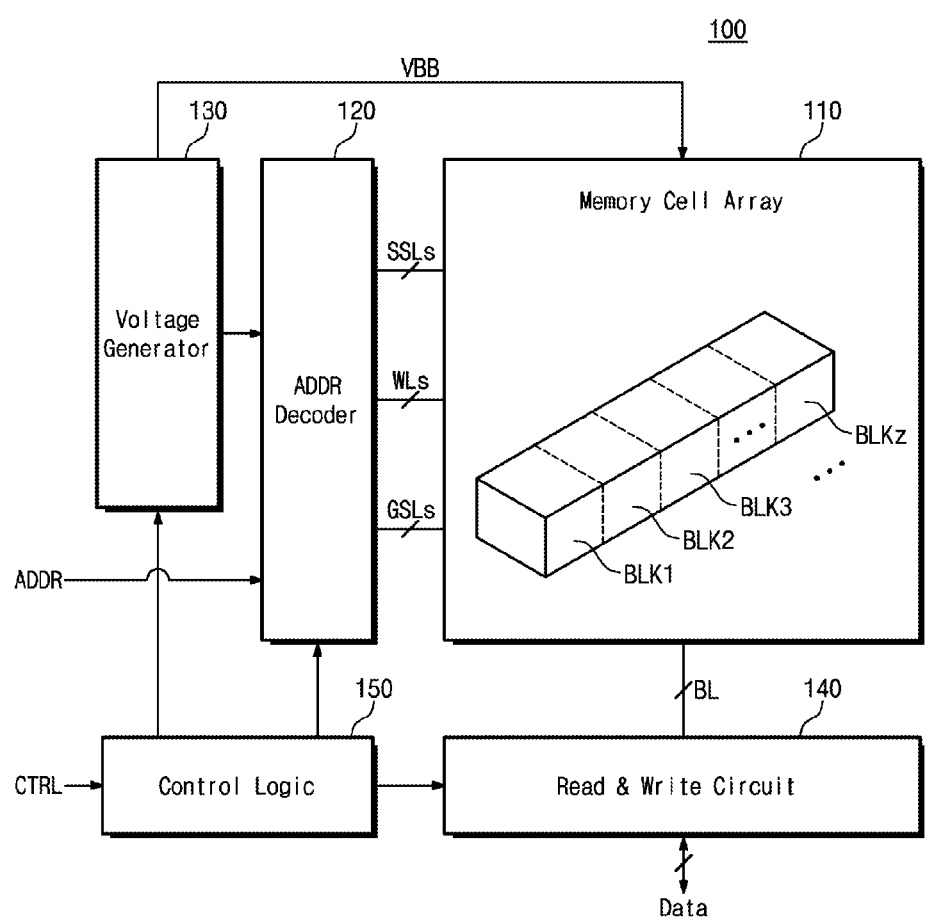
FIG. 1 is a block diagram illustrating a nonvolatile memory device in accordance with some embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Some embodiments of the inventive concept may be described with reference to NAND flash memories. However, a spirit of the inventive concept is not limited to the NAND flash memory. A spirit of the inventive concept may be applied to various nonvolatile memory devices such as an EEPROM (electrically erasable and programmable ROM), a NOR flash memory device, a PRAM (phase change RAM), a MRAM (magnetic RAM), a RRAM (resistive RAM), a FRAM (ferroelectric RAM), etc.

A nonvolatile memory device in accordance with some embodiments of the inventive concept controls a substrate voltage being applied to the substrate so that a threshold voltage of a ground select transistor becomes higher than a critical value. An electric potential among channels inside a sell string is reduced and thereby a read disturbance is prevented. Thus, a nonvolatile memory device having improved reliability and a method thereof are provided.

FIG. 1 is a block diagram illustrating a nonvolatile memory device in accordance with some embodiments of the inventive concept. Referring to FIG. 1, a nonvolatile memory device 100 includes a memory cell array 110, an address decoder 120, a voltage generator 130, a read & write circuit 140, and a control logic 150.

The memory cell array 110 is connected to the address decoder 120 through string select lines SSL, word lines WL and ground select lines GSL, and is connected to the read & write circuit 140 through bit lines BL. The memory cell array includes a plurality of memory blocks BLK1~BLKz. Each memory block may include a plurality of memory cells and a plurality of select transistors. The memory cells may be connected to the word lines WL and the select transistors may be connected to the string select lines SSL or the ground select lines GSL. The memory cells of each memory block may be stacked in a direction perpendicular to a substrate to form a three-dimensional structure. The memory cells of each memory block can store one or more bits.

The address decoder 120 is connected to the memory cell array 110 through the string select lines SSL, the word lines WL and the ground select lines GSL. The address decoder 120 is configured to operate in response to a control of the control logic 150. The address decoder 120 receives an address ADDR from an external device.

The address decoder 120 is configured to decode a row address among the received address ADDR. Using the decoded row address, the address decoder 120 selects the string select lines SSL, the word lines WL and the ground select lines GSL. The address decoder 120 can receive various voltages from the voltage generator 130 and transmit the received voltages to selected or unselected string select lines SSL, the word lines WL and the ground select lines GSL respectively.

The voltage generator 130 is configured to generate various voltages being required in the nonvolatile memory device 100. For example, the voltage generator 130 can generate a plurality of program voltages, a plurality of pass voltages, a plurality of select read voltages, a plurality of unselect read voltages and a substrate voltage VBB being provided to a substrate of the memory cell array 110. In the case where a selected word line satisfies a precharge condition, the voltage generator 130 can generate a first program voltage and a second program voltage being applied to the selected word line.

The read & write circuit 140 is connected to the memory cell array 110 through bit lines BL and exchanges data with the outside. The read & write circuit 140 operates in response to a control of the control logic 150. The read & write circuit 140 is configured to receive a decoded column address DCA from the address decoder 120. Using the decoded column address DCA, the read & write circuit 140 can select bit lines BL.

The read & write circuit 140 receives data from the outside and writes the received data in the memory cell array 110. The read & write circuit 140 reads data from the memory cell array 110 and transmits the read data to the outside. The read & write circuit 140 reads data from a first storage area of the memory cell array 110 and writes the read data in a second storage area of the memory cell array 110. For example, the read & write circuit 140 is configured to perform a copy-back operation.

The read & write circuit 140 can store data to be programmed in memory cells connected to a selected word line among word lines of a memory block selected in a program operation.

The read & write circuit 140 includes constituent elements such as a page buffer (or page register), a column select circuit, a data buffer, etc. The read & write circuit 140 also includes constituent elements such as a sense amplifier, a write driver, a column select circuit, a data buffer, etc.

The control logic 150 is connected to the address decoder 120 and the read & write circuit 140. The control logic 150 is configured to control an overall operation of the nonvolatile memory device 100. The control logic 150 operates in response to a control signal CTRL being transmitted from the outside.

In a program operation, in the case where a selected word line satisfies a precharge condition, the control logic 150 can control operations so that a program voltage being applied to the selected word line is applied earlier than a pass voltage being applied to an unselected word line. In a program operation, in the case where a selected word line does not satisfy a precharge condition, the control logic 150 can control operations so that a program voltage being applied to the selected word line is applied simultaneously with or later than a pass voltage being applied to an unselected word line.

In a program operation, in the case where a selected word line satisfies a precharge condition, the control logic 150 may be configured so that a program voltage being applied to the selected word line is applied earlier than a pass voltage being applied to an unselected word line.

Figure 2:
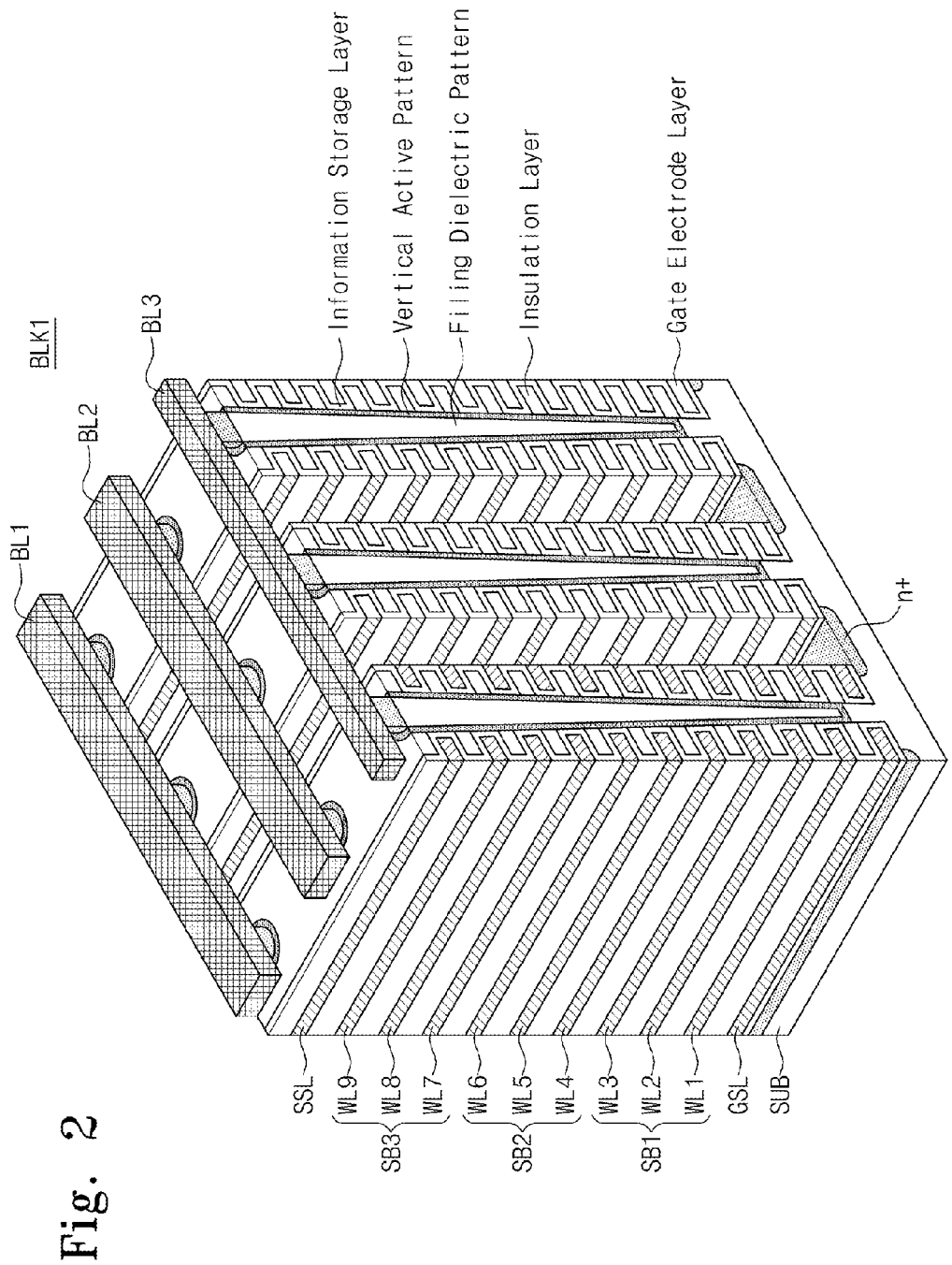
FIG. 2 is a perspective view illustrating a three-dimensional structure of a memory block illustrated in FIG. 1.

FIG. 2 is a perspective view illustrating a three-dimensional structure of a memory block illustrated in FIG. 1. Referring to FIG. 2, a memory block BLK1 is formed in a direction perpendicular to a substrate SUB. The substrate SUB may be a well having a first conductivity type. For example, the substrate SUB may be a P well formed by implanting a group III element such as boron. The substrate SUB may be a pocket P well being provided in an N well. It is assumed that the substrate SUB is a P well (or pocket P well). However, the substrate SUB is not limited to having a P conductivity type. A gate electrode layer and an insulation layer are alternately deposited on the substrate SUB.

An information storage layer may be formed between the gate electrode layer and the insulation layer. The information storage layer may be formed by a tunnel storage layer, a charge storage layer and a blocking insulation layer.

A pillar having a V character shape is formed by vertically patterning the gate electrode layer and the insulation layer. The pillar penetrates the gate electrode layer and the insulation layer to be connected to the substrate SUB. The inside of the pillar is a filling dielectric pattern and may be formed by an insulation material such as silicon oxide. The outside of the pillar is a vertical active pattern and may be formed by channel semiconductor.

A ground select transistor GST may be formed on the substrate SUB to be affected by a body effect according to a change of a substrate voltage VBB. That is, a threshold voltage of the ground select transistor GST may be controlled by controlling the substrate voltage VBB. For example, in the case where the substrate SUB is a P conductivity type and the substrate voltage VBB is a negative voltage, a threshold voltage of the ground select transistor GST may increase. In the case where the substrate SUB is an N conductivity type and the substrate voltage VBB is a positive voltage, a threshold voltage of the ground select transistor GST may increase. Since memory cells are electrically isolated from the substrate SUB, the memory cells may not be affected by the substrate voltage.

The ground select transistor GST may have a threshold voltage greater than a critical value according to a change of the substrate voltage VBB. At this time, the critical value may be a level higher than a threshold voltage distribution of an erase state or a threshold voltage distribution of a program state of the memory cells.

A gate electrode layer of the memory block BLK1 may be connected to a ground select line GSL, a plurality of word lines WL1~WL9, and a string select line SSL. A pillar of the memory block BLK1 may be connected to a plurality of bit lines BL1~BL3. In FIG. 2, the memory block BLK1 has two select lines SSL and GSL, nine word lines WL1~WL9, and three bit lines BL1~BL3 but the inventive concept is not limited thereto.

Figure 3:
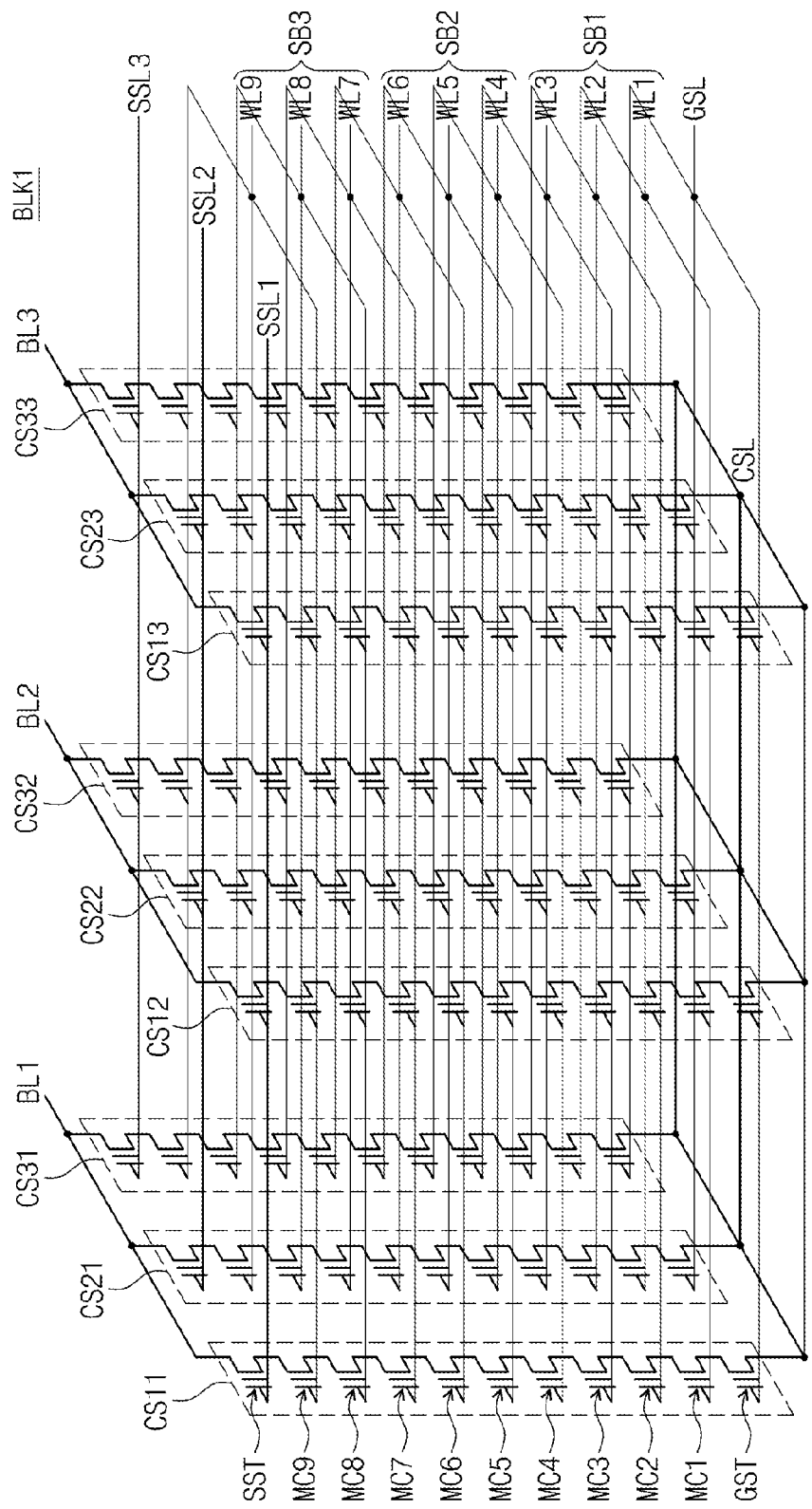
FIG. 3 is a schematic diagram of an equivalent circuit of the memory block illustrated in FIG. 2.

FIG. 3 is an equivalent circuit of the memory block illustrated in FIG. 2. Referring to FIG. 3, cell strings CS11~CS33 are connected between bit lines BL1~BL3 and a common source line CSL. Each cell string (for example, CS11) includes a ground select transistor GST, a plurality of memory cells MC1~MC9, and a string select transistor SST. Herein, the cell string may be called a NAND string.

The string select transistor SST is connected to a string select line SSL. The string select line is divided into first through third string select lines SSL1~SSL3. The memory cells MC1~MC9 are connected to respective corresponding word lines WL1~WL9. Word lines (e.g., WL4) having the same height are connected in common. The ground select transistor GST is connected to a ground select line GSL. The ground select lines of the cell strings CS11~CS33 are connected to one another. The string select transistor SST is connected to the bit line BL and the ground select transistor GST is connected to the common source line CSL.

The memory block BLK1 illustrated in FIGS. 2 and 3 is illustrative. A technical spirit of the inventive concept is not limited to the memory block BLK1 illustrated in FIGS. 2 and 3. The number of rows of the cell strings may increase or decrease. As the number of rows of the cell strings is changed, the number of string select lines or ground select lines being connected to rows of the cell strings and the number of the cell strings being connected to one bit line may also be changed.

The number of columns of the cell strings may increase or decrease. As the number of columns of the cell strings is changed, the number of bit lines being connected to columns of the cell strings and the number of the cell strings being connected to one string select line may also be changed.

A height of the cell strings may increase or decrease. For example, the number of memory cells being stacked on each cell string may increase or decrease. As the number of memory cells being stacked on each cell string may be changed, the number of word lines may also be changed. For example, the number of string select transistors or ground select transistors being provided to each cell string may increase. As the number of string select transistors or ground select transistors being provided to each cell string is changed, the number of string select lines or ground select lines may also be changed. If the number of string select transistors or ground select transistors increases, the string select transistors or the ground select transistors may be stacked in the same form as the memory cells MC1~MC9.

Write and read operations can be performed by a row unit of the cell strings CS11~CS33. The cell strings CS11~CS33 can be selected by one row unit by the string select lines SSL1~SSL3.

In a selected row of the cell strings CS11~CS33, write and read operations may be performed by a page unit. The page may be one row of memory cells connected to one word line. In a selected row of the cell strings CS11~CS33, memory cells may be selected by a page unit by the word lines WL1~WL9.

According to some embodiments of the inventive concept, when performing a program operation on a selected cell string, the memory cell array 110 performs a program operation in the order of memory cells adjacent to the ground select transistor GST or in the order of memory cells adjacent to the string select transistor SST.

As described above, the memory cell array 110 includes a plurality of memory blocks. In the conventional case, a memory cell array performs an erase operation by a memory block unit.

According to some embodiments of the inventive concept, a memory block BLK1 may include first through third sub blocks. The first sub block may include memory cells connected to the word lines WL1~WL3, the second sub block may include memory cells connected to the word lines WL4~WL6 and third sub block may include memory cells connected to the word lines WL7~WL9.

According to some embodiments of the inventive concept, the memory cell array 110 performs an erase operation by a sub block unit. Each memory block includes a plurality of sub memory blocks. That is, in an erase operation, the memory cell array 110 may perform an erase operation on the basis of erase-requested sub blocks among the sub blocks.

Figure 4:
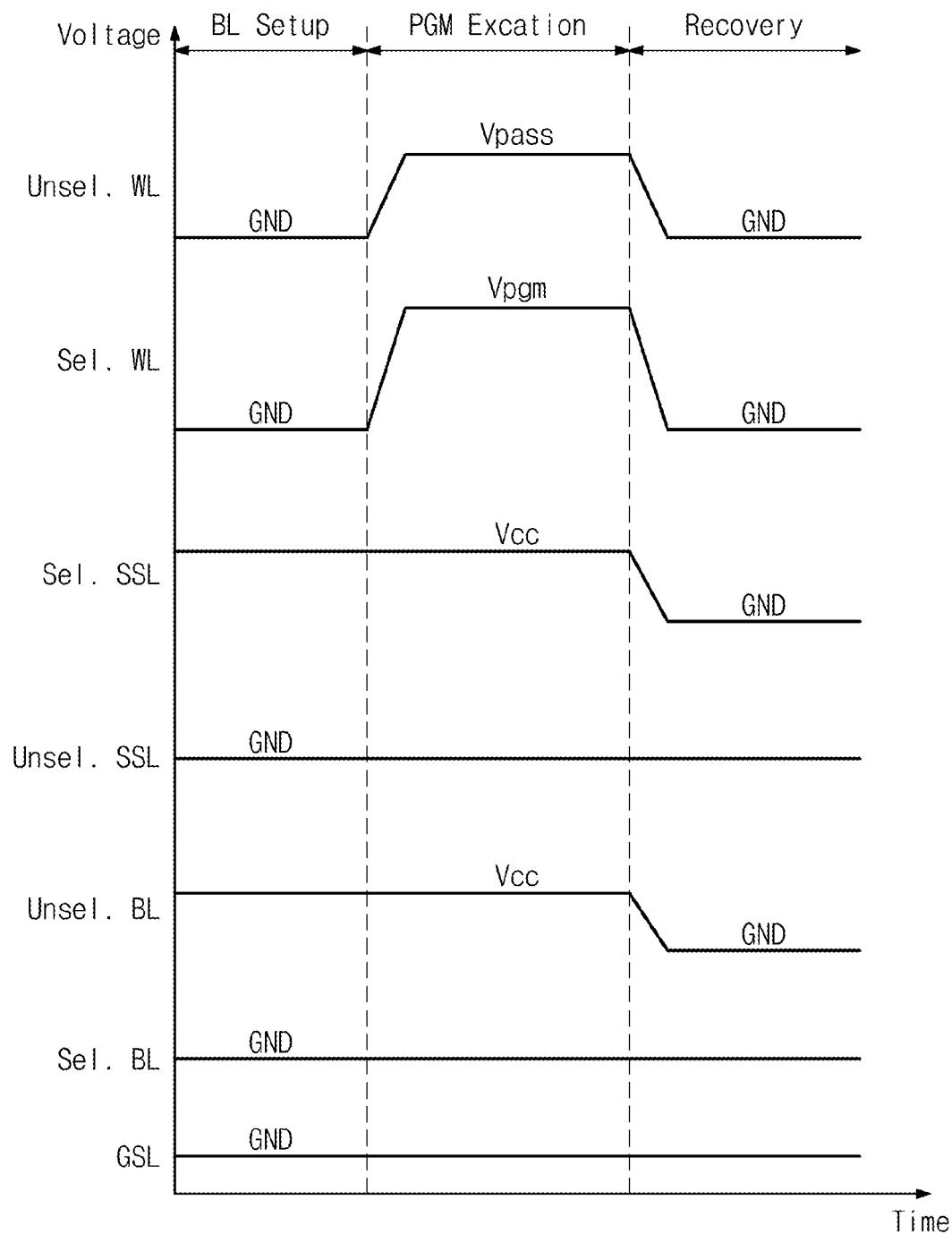
FIG. 4 is a timing diagram illustrating signals being applied in the case where a word line selected in a program operation of the nonvolatile memory device illustrated in FIG. 1 does not satisfy a precharge condition.

FIG. 4 is a timing diagram illustrating signals being applied in the case where a word line selected in a program operation of the nonvolatile memory device illustrated in FIG. 1 does not satisfy a precharge condition.

Referring to FIGS. 3 and 4, a ground voltage is applied to unselected word lines during a bit line setup period, a pass voltage is applied to the unselected word lines during a program execution period and a ground voltage GND is applied to the unselected word lines during a recovery period.

In the case where a selected word line does not satisfy a precharge condition, the ground voltage GND is applied to the selected word line during the bit line setup period, a program voltage Vpgm is applied to the selected word line during the program execution period and the ground voltage GND is applied to the selected word line during the recovery period. In the case where the selected word line satisfies the precharge condition, the program voltage being applied to the selected word line is applied before the pass voltage being applied to the unselected word lines.

A power supply voltage VCC is applied to a selected string select line during the bit line setup period and the program execution period, and the ground voltage GND is applied to the selected string select line during the recovery period.

The ground voltage GND is applied to an unselected string select line during the bit line setup period, the program execution period, and the recovery period. The ground voltage GND is applied to a selected bit line during the bit line setup period, the program execution period, and the recovery period.

The power supply voltage VCC is applied to an unselected bit line during the bit line setup period and the program execution period, and the ground voltage GND is applied to the unselected bit line during the recovery period. The ground voltage GND is applied to a ground select line during the bit line setup period, the program execution period, and the recovery period.

Figure 5:
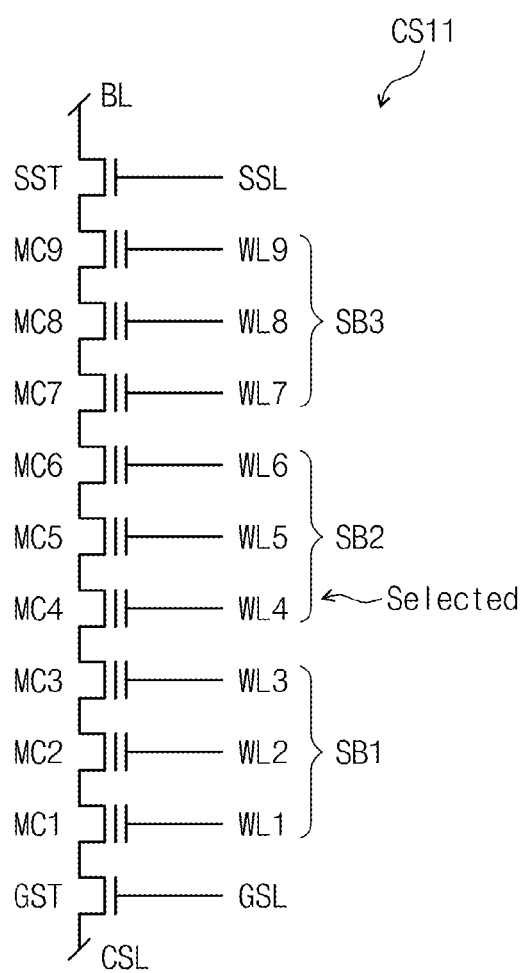
FIG. 5 is a diagram illustrating one cell string of the memory block illustrated in FIG. 3.

FIG. 5 is a drawing illustrating one cell string of the memory block illustrated in FIG. 3. The cell string CS11 of FIG. 5 may be an unselect cell string. That is, the cell string CS11 may be connected to an unselected bit line. The cell string CS11 may also be connected to a selected bit line and an unselected string select line.

The cell string CS11 includes first through ninth memory cells MC1~MC9, a string select transistor SST, and a ground select transistor GST. The first through ninth memory cells MC1~MC9 are connected to first through ninth word lines WL1~WL9 respectively. Each of the first through ninth memory cells MC1~MC9 may be provided by a single level cell storing 1-bit data and a multi level cell storing two or more bit data.

Channels of the first through ninth memory cells MC1~MC9 of the unselect cell string CS11 are floated during a program execution period. As a pass voltage or a program voltage is applied to the word lines WL1~WL9 during the program execution period, a channel voltage of the first through ninth memory cells MC1~MC9 may increase. It is assumed that the fourth memory cell MC4 is a select memory cell.

Figure 6:
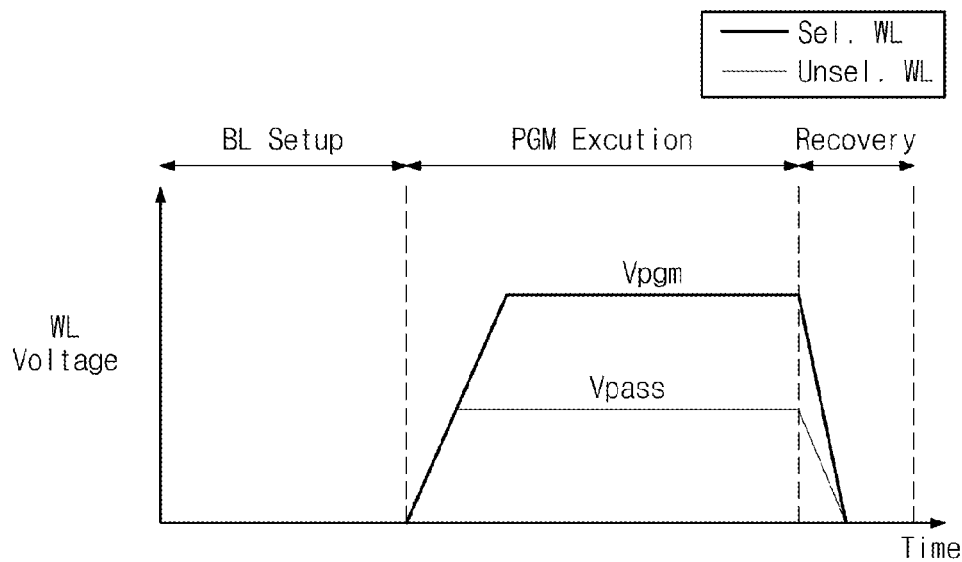
FIG. 6 is a graph illustrating a voltage being applied to word lines during one program loop in a comparison example.
Figure 7:
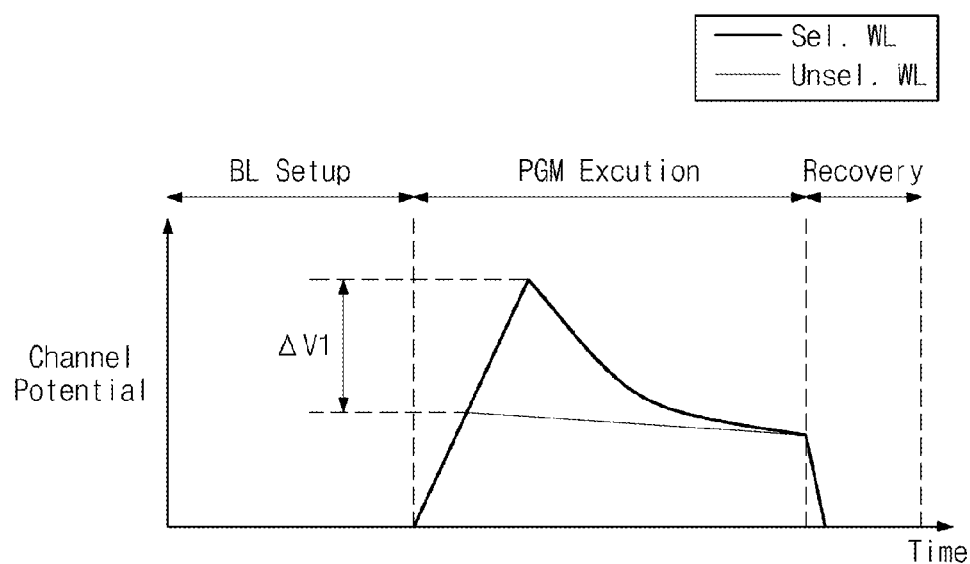
FIG. 7 is a graph illustrating a channel voltage of memory cells of an unselected cell string in a comparison example.

FIG. 6 is a drawing illustrating a voltage being applied to word lines during one program loop in a comparison example. FIG. 7 is a drawing illustrating a channel voltage of memory cells of an unselect cell string in a comparison example.

Referring to FIGS. 5 through 7, a program voltage Vpgm is applied to a selected word line WL4 during a program execution period and a pass voltage Vpass is applied to unselected word lines WL1~WL3 and WL5~WL9. The program voltage Vpgm and the pass voltage Vpass may be applied to each word line at the same time.

As the pass voltage Vpass is applied to unselected word lines WL1~WL3 and WL5~WL9, a channel voltage of unselect memory cells MC1~MC3 and MC5~MC9 increases. While the pass voltage Vpass applied to the unselected word lines WL1~WL3 and WL5~WL9 is maintained, the channel voltage of unselect memory cells MC1~MC3 and MC5~MC9 may be gently decreased or may almost not be decreased. After that, the channel voltage of unselect memory cells MC1~MC3 and MC5~MC9 is sharply decreased within a recovery period in which the pass voltage Vpass applied to the unselected word lines WL1~WL3 and WL5~WL9 is decreased.

As the program voltage Vpgm is applied to the selected word line WL4, a channel voltage of the select memory cell MC4 increases. Due to a level difference between the program voltage Vpgm and the pass voltage Vpass, a difference between the maximum channel voltage of the select memory cell MC4 and the maximum channel voltage of the unselect memory cells MC1~MC3 and MC5~MC9 may be a first voltage difference ΔV1.

While the program voltage Vpgm applied to the selected word line WL4 is maintained, a channel of the memory cells MC1~MC9 shares charges and thereby a channel voltage of the select memory cell MC4 is decreased. After that, the channel voltage of the select memory cell MC4 is sharply decreased within the recovery period in which the program voltage Vpgm applied to the selected word line WL4 is decreased.

In the case where the first voltage difference ΔV1 exceeds an allowable range, a thermal electron may be generated between the select memory cell MC4 and the unselect memory cells MC3 and MC5 adjacent to the select memory cell MC4. The generated thermal electron may be trapped in the select memory cell MC4 and arouses a change of a threshold voltage of the select memory cell MC4. That is, the first voltage difference ΔV1 exceeding the allowable range may cause a program disturbance.

Figure 8:
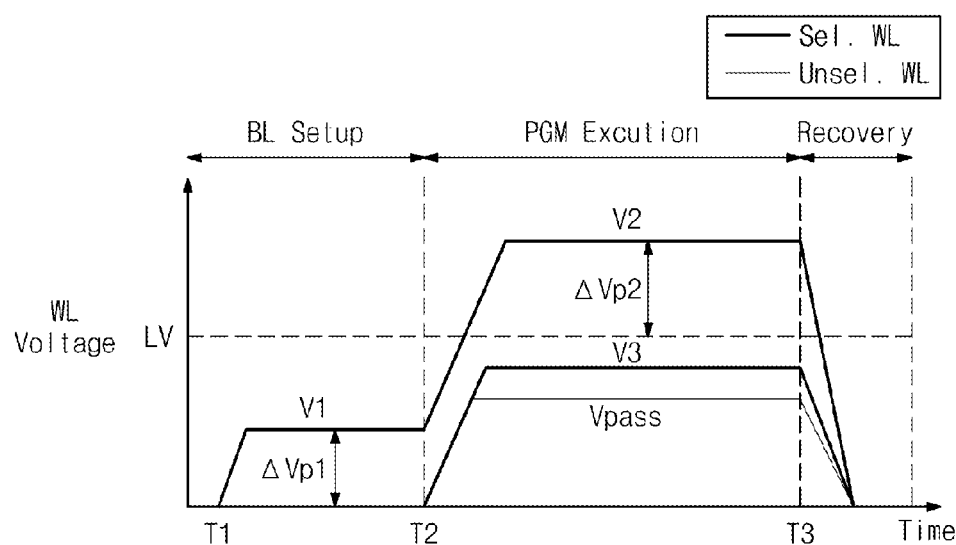
FIG. 8 is a graph illustrating a voltage being applied to word lines during one program loop in some embodiments of the inventive concept.
Figure 9:
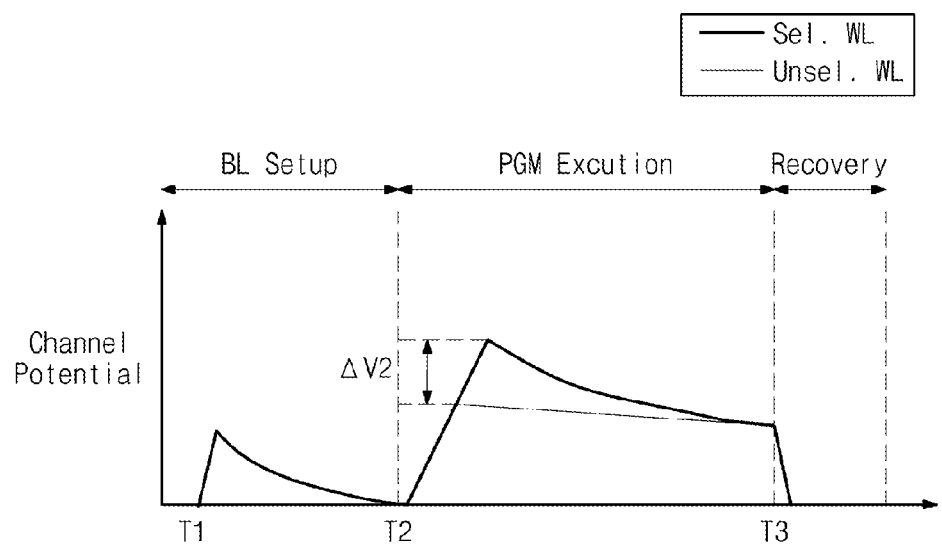
FIG. 9 is a graph illustrating a channel voltage of memory cells of an unselected cell string in an embodiment of the inventive concept.

FIG. 8 is a drawing illustrating a voltage being applied to word lines during one program loop in some embodiments of the inventive concept. FIG. 9 is a drawing illustrating a channel voltage of memory cells of an unselect cell string in an embodiment of the inventive concept.

Referring to FIGS. 5, 8 and 9, the pass voltage Vpass is applied to the unselected word lines WL1~WL3 and WL5~WL9 during the program execution period.

In the case where the selected word line WL4 satisfies a precharge condition, the control logic 150 (refer to FIG. 1) controls operation so that a program voltage (V1, V2) being applied to the selected word line WL4 is applied before the pass voltage Vpass being applied to the unselected word lines WL1~WL3 and WL5~WL9. In the case where the selected word line WL4 does not satisfy a precharge condition, the control logic 150 controls operation so that a program voltage V3 being applied to the selected word line WL4 is not applied before the pass voltage Vpass being applied to the unselected word lines WL1~WL3 and WL5~WL9.

The precharge condition is that the maximum level of the program voltage being applied to the selected word line is greater than a predetermined allowable level LV. The allowable level LV means a program voltage level in which a program disturbance does not occur.

Since the maximum level of the program voltage (V1, V2) is greater than the allowable level LV, in the case where the program voltage (V1, V2) is applied to the selected word line WL4, the selected word line WL4 satisfies the precharge condition.

The program voltage (V1, V2) may be applied to the selected word line WL4 from a specific time within the bit line setup period.

The program voltage (V1, V2) being applied to the selected word line WL4 may include a first program voltage V1 and a second program voltage V2. The first program voltage V1 may be applied to the selected word line WL4 from a first time T1 within a bit line setup period to a second time T2 at which a program execution period starts. The second program voltage V2 may be applied to the selected word line WL4 from the second time T2 to a third time T3 at which the recovery period starts.

The pass voltage Vpass being applied to the unselected word lines WL1~WL3 and WL5~WL9 may be applied from the second time T2 to the third time T3.

Since the maximum level of the program voltage V3 is smaller than the allowable level LV, in the case where the program voltage V3 is applied to the selected word line WL4, the selected word line WL4 does not satisfy the precharge condition. The program voltage V3 being applied to the selected word line WL4 may be applied from the second time T2 to the third time T3.

As the first program voltage V1 is applied to the selected word line WL4, a channel voltage of the select memory cell MC4 increases from the first time T1. While the first program voltage V1 applied to the selected word line WL4 is maintained, a channel of the memory cells MC1~MC9 shares charges and thereby a channel voltage is decreased.

After that, as the second voltage V2 is applied to the selected word line WL4, a channel voltage of the select memory cell MC4 increases from the second time T2. Due to a level difference between the second program voltage V2 and the pass voltage Vpass, a difference between the maximum channel voltage of the select memory cell MC4 and the maximum channel voltage of the unselect memory cells MC1~MC3 and MC5~MC9 may be a second voltage difference ΔV2.

After the second time T2, a channel voltage of the select memory cell MC4 increases by a level difference between the first program voltage V1 and the second program voltage V2. Thus, in the case where a level of the program voltage Vpgm of FIG. 6 is the same as a level of the second program voltage V2 of FIG. 8, the second voltage difference ΔV2 is smaller than the first voltage difference ΔV1. That is, according to the program method of the embodiments of the inventive concept, a program disturbance may be eased, reduced or avoided in a select memory cell of the unselect string compared with a comparison example.

After that, while the second program voltage V2 applied to the selected word line WL4 is maintained, the channel of the memory cells MC1~MC9 shares charges and thereby a channel voltage of the select memory cell MC4 is decreased. After that, the channel voltage of the select memory cell MC4 is sharply decreased within the recovery period in which the second program voltage V2 applied to the selected word line WL4 is decreased.

In some embodiments of the inventive concept, a level of the first program voltage V1 may be proportional to a level of the second program voltage V2. That is, as the level of the second program voltage V2 increases, the level of the first program voltage V1 may also increase. This is because the maximum channel voltage of the select memory cell MC4 is affected by a level difference between the first program voltage V1 and the second program voltage V2.

A level ΔVp1 of the first program voltage V1 may be proportional to a voltage difference ΔVp2 between the second program voltage V2 and the allowable level LV. The level ΔVp1 of the first program voltage V1 may also be the same as the voltage difference ΔVp2 between the second program voltage V2 and the allowable level LV.

A period between the first time T1 at which the first program voltage V1 and the second time T2 is applied may be proportional to a level of the first program voltage V1. That is, as the level of the first program voltage V1 increases, the first time T1 at which the first program voltage V1 is moved forward and thereby the period between the first time T1 and the second time T2 may increase. This is because the time it takes for a channel voltage of the select memory cell MC4 increased by the first program voltage V1 to decrease is proportional to the level of the first program voltage V1.

The level of the first program voltage V1 may be lower than a level of the pass voltage Vpass. If the level of the first program voltage V1 is higher than the level of the pass voltage Vpass, a program disturbance in a select memory cell of the unselect string due to the first program voltage V1 may become a problem.

Figure 10:
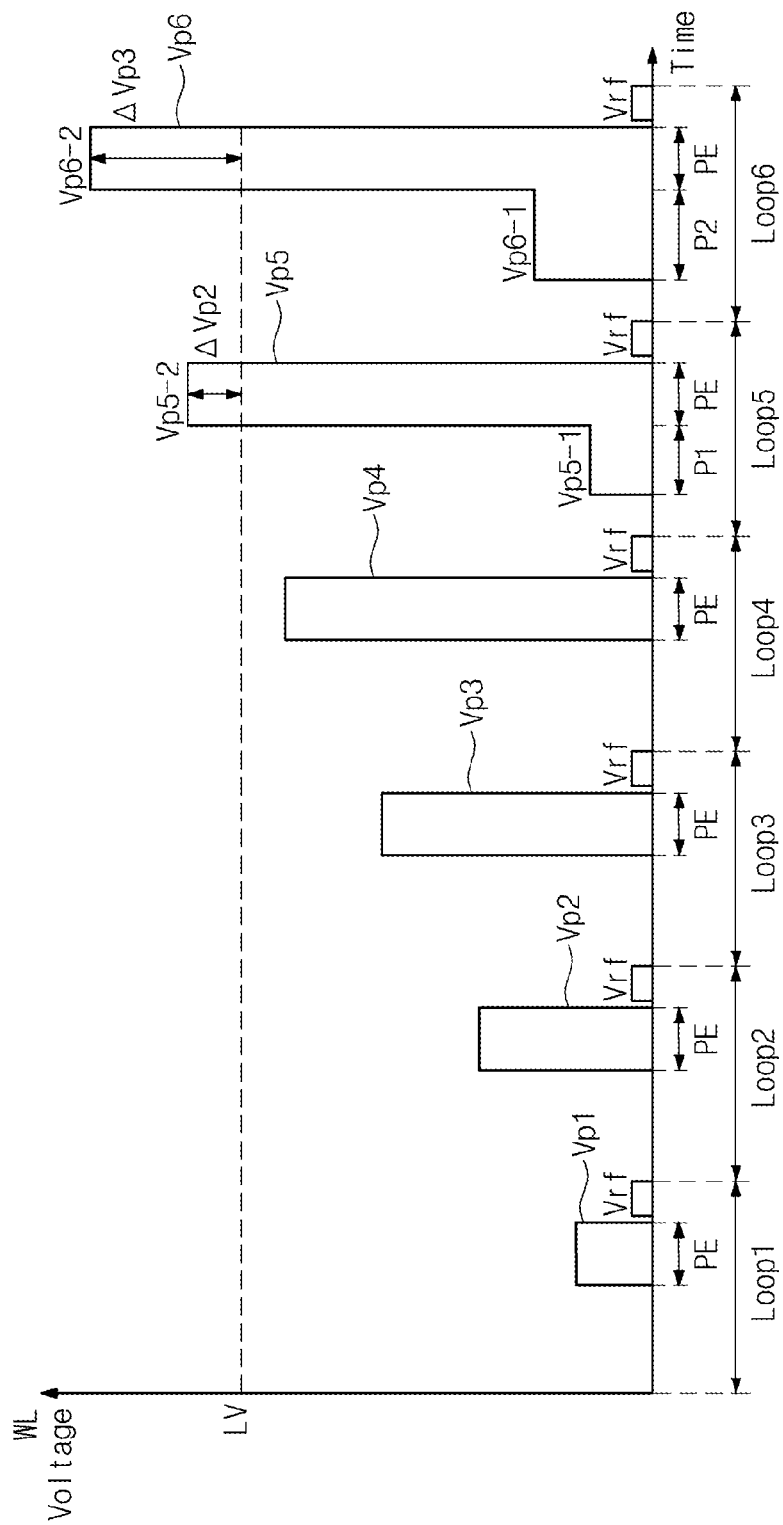
FIG. 10 is a timing diagram illustrating a voltage being applied to word lines during a plurality of program loops of a nonvolatile memory device according to an embodiment of the inventive concept.

FIG. 10 is a drawing illustrating a voltage being applied to word lines during a plurality of program loops of a nonvolatile memory device according to an embodiment of the inventive concept. FIG. 10 illustrates a program operation with respect to a single level cell SLC.

A program operation may be performed by proceeding with a plurality of program loops. In FIG. 10, 6 program loops are performed but the inventive concept is not limited thereto. The program operation may be performed by proceeding with 7 or more program loops or may be performed by proceeding with 5 or less program loops.

Each program loop includes a step of applying program voltages Vp1~Vp6 and a pass voltage, and a step of applying a verification voltage Vrf. The program voltages Vp1~Vp6 and the verification voltage Vrf may be generated in the voltage generator 130 (refer to FIG. 1).

As a program loop proceeds, a level of the program voltages Vp1~Vp6 may increase. This is called an incremental step pulse programming (ISPP) method.

In FIG. 10, the verification voltage Vrf has one voltage level at each program loop but the inventive concept is not limited thereto. The verification voltage Vrf may include a first verification voltage and a second verification voltage having different levels. The first verification voltage may be a coarse verification voltage and the second verification voltage may be a fine verification voltage. In the case where memory cells connected to a selected word line are multi level cells MLC, the verification voltage Vrf may have 3 or more different voltage levels.

A precharge condition may be that a program voltage being applied to a selected word line corresponds to a program loop in the first reference number in inverse order of a program loop proceeding order among one program step defined by a plurality of program loops. The first reference number is one or more predetermined values and may be the number of program loops having a program voltage having the maximum level greater than an allowable level.

In the last program loop or program loops adjacent to the last program loop, the program voltage being applied to the selected word line WL4 may be applied before the pass voltage being applied to the unselected word lines WL1~WL3 and WL5~WL9.

In FIG. 10, the first reference number is two. It is assumed that program voltages Vp1~Vp4 of early program loops Loop1~Loop4 are smaller than the allowable level LV and program voltages Vp5 and Vp6 of latter program loops Loop5 and Loop6 are greater than the allowable level LV.

In the early program loops Loop1~Loop4, the pass voltage Vpass and the program voltages Vp1~Vp4 may be applied to word lines during a program execution period.

Since the program voltages Vp5 and Vp6 of the latter program loops Loop5 and Loop6 have a level greater than the allowable level, they are applied before the pass voltage Vpass.

The program voltage Vp5 of the fifth program loop Loop5 may include a first program voltage Vp5-1 being applied during a first period P1 and a second program voltage Vp5-2 being applied during a program execution period PE. The program voltage Vp6 of the sixth program loop Loop6 may include a first program voltage Vp6-1 being applied during a second period P2 and a second program voltage Vp6-2 being applied during a program execution period PE. The first period P1 and the second period P2 may be a part of a bit line setup period.

According to the program method of some embodiments of the inventive concept, a program disturbance may ease in a select memory cell of an unselect string.

Figure 11:
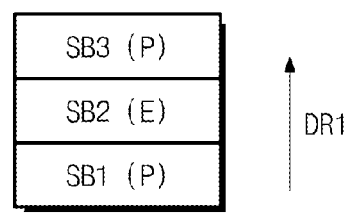
FIG. 11 is a diagram illustrating the memory block of FIG. 3 according to an embodiment of the inventive concept.
Figure 12:
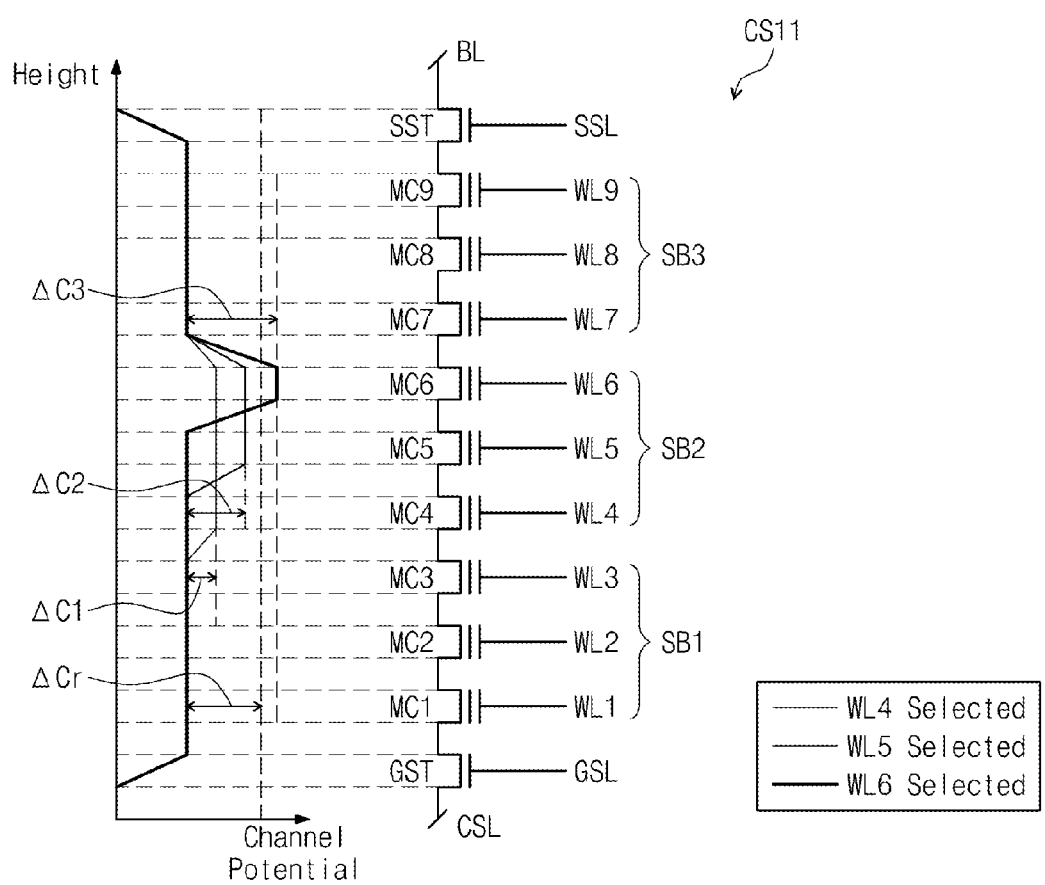
FIG. 12 is a drawing illustrating a channel voltage of one unselect cell string in the memory block of FIG. 11.

FIG. 11 is a drawing illustrating the memory block of FIG. 3 according to an embodiment of the inventive concept. FIG. 12 is a drawing illustrating a channel voltage of one unselect cell string in the memory block of FIG. 11. In the graph of FIG. 12, a horizontal axis represents a voltage of a channel and a vertical axis represents a height of memory cells.

Referring to FIGS. 11 and 12, it is assumed that memory cells included in a first sub block SB1 and a third sub block SB3 have a program state P and memory cells included in a second sub block SB2 have an erase state E.

First through third memory cells MC1~MC3 connected to first through third word lines WL1~WL3 are included in the first sub block SB1. Fourth through sixth memory cells MC4~MC6 connected to fourth through sixth word lines WL4~WL6 are included in the second sub block SB2.

Seventh through ninth memory cells MC7~MC9 connected to seventh through ninth word lines WL7~WL9 are included in the third sub block SB3.

In a program operation, a string select transistor SST and a ground select transistor GST of an unselect cell string CS11 maintain a turn-off state. Channels of memory cells MC1~MC9 are floated.

A precharge condition may be that a selected word line is connected to the second sub block SB2 of an erase state disposed between the first and third sub blocks SB1 and SB3 of a program state and corresponds to the second reference number in inverse order of a program order DR1 among the word lines WL4~WL6 connected to the second sub block SB2 of the erase state. The second reference number is one or more predetermined values and may be the number of select memory cells of which a channel voltage difference is greater than the allowable channel voltage difference as compared with unselect memory cells in one cell string. The allowable channel voltage difference means a channel voltage difference that does not cause a program disturbance between a channel select memory cell and an unselect memory cell.

In the case where a channel voltage difference between the select memory cell MC6 and the unselect memory cells MC1~MC5 and MC7~MC9 is greater than the allowable channel voltage difference ΔCr, a program voltage being applied to the selected word line WL6 connected to the select memory cell MC6 is applied before a pass voltage.

A program operation of the second sub block SB2 may be performed by sequentially selecting the word lines WL4~WL6. Referring to FIGS. 11 and 12, the first reference number is one as an illustration. A program voltage being applied to the sixth word line WL6 connected to the sixth memory cell MC6 which is connected to the second sub block SB2 and programmed at the end may be applied before the pass voltage. A program voltage being applied to the fourth and fifth word lines WL4 and WL5 connected to the fourth and fifth memory cells MC4 and MC5 may not be applied before the pass voltage.

If the program operation starts with respect to the second sub block SB2, the word line WL4 is selected and a program voltage is applied to the selected word line WL4. The pass voltage is applied to the unselected word lines WL1~WL3 and WL5~WL9. A channel voltage of the memory cells MC1~MC9 may be boosted by the pass voltage and the program voltage to increase. A threshold voltage of the memory cells MC1~MC3 and MC7~MC9 of a program state P is higher than that of the memory cells MC4~MC6 of an erase state E. Accordingly, a channel voltage of the memory cells MC4~MC6 is higher than a channel voltage of the memory cells MC1~MC3 and MC7~MC9.

In the case where the fourth word line WL4 is the selected word line WL4, the memory cells MC4~MC6 and the memory cells MC1~MC3 and MC7~MC9 have a first channel voltage difference ΔC1. The first channel voltage difference ΔC1 may be smaller than the allowable channel voltage difference ΔCr. The allowable channel voltage difference ΔCr means a difference between a channel voltage of memory cells of a program state in which a program disturbance does not occur and a channel voltage of memory cells of an erase state.

After the fourth memory cell MC4 is converted into a program state, the word line WL5 is selected and a program voltage is applied to the selected word line WL5. A pass voltage is applied to the unselected word lines WL1~WL4 and WL6~WL9. The memory cell MC4 is converted into a program state and thereby the number of memory cells MC5 and MC6 of an erase state E is reduced. A channel boosting efficiency of the memory cells MC5 and MC6 of an erase state E increases.

In the case where the fifth word line WL5 is a selected word line WL5, a difference between the memory cells MC5 and MC6 and the memory cells MC1~MC4 and MC7~MC9 is a second channel voltage difference ΔC2. The second channel voltage difference ΔC2 may be smaller than the allowable channel voltage difference ΔCr.

After the fifth memory MC5 is converted into a program state, the word line WL6 is selected and a program voltage is applied to the selected word line WL6. A pass voltage is applied to the unselected word lines WL1~WL5 and WL7~WL9. The memory cell MC5 is converted into a program state and thereby the number of memory cells MC6 of an erase state E is reduced. A channel boosting efficiency of the memory cells MC6 of an erase state E increases.

In the case where the sixth word line WL6 is a selected word line WL6, a difference between the select memory cell MC6 and the unselect memory cells MC1~MC5 and MC7~MC9 is a third channel voltage difference ΔC3. The third channel voltage difference ΔC3 may be greater than the allowable channel voltage difference ΔCr.

In the case where the third channel voltage difference ΔC3 may be greater than the allowable channel voltage difference ΔCr, thermal electrons may be generated between the select memory cell MC6 and the unselect memory cells MC5 and MC7 adjacent to the select memory cell MC6. The generated thermal electrons may be trapped in the select memory cell MC6 and may cause a threshold voltage change of the select memory cell MC6. That is, in the case that the third channel voltage difference ΔC3 is greater than the allowable channel voltage difference ΔCr, a program disturbance may occur.

In the case where a selected word line satisfies a precharge condition, a program disturbance in a select memory cell of the unselected memory cell may be eased by applying a program voltage being applied to the selected word line before a pass voltage being applied to the unselected word lines.

Figure 13:
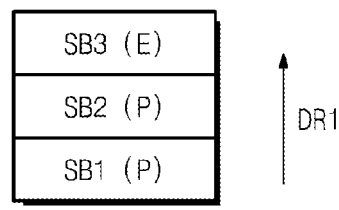
FIG. 13 is a diagram illustrating the memory block of FIG. 3 according to another embodiment of the inventive concept.
Figure 14:
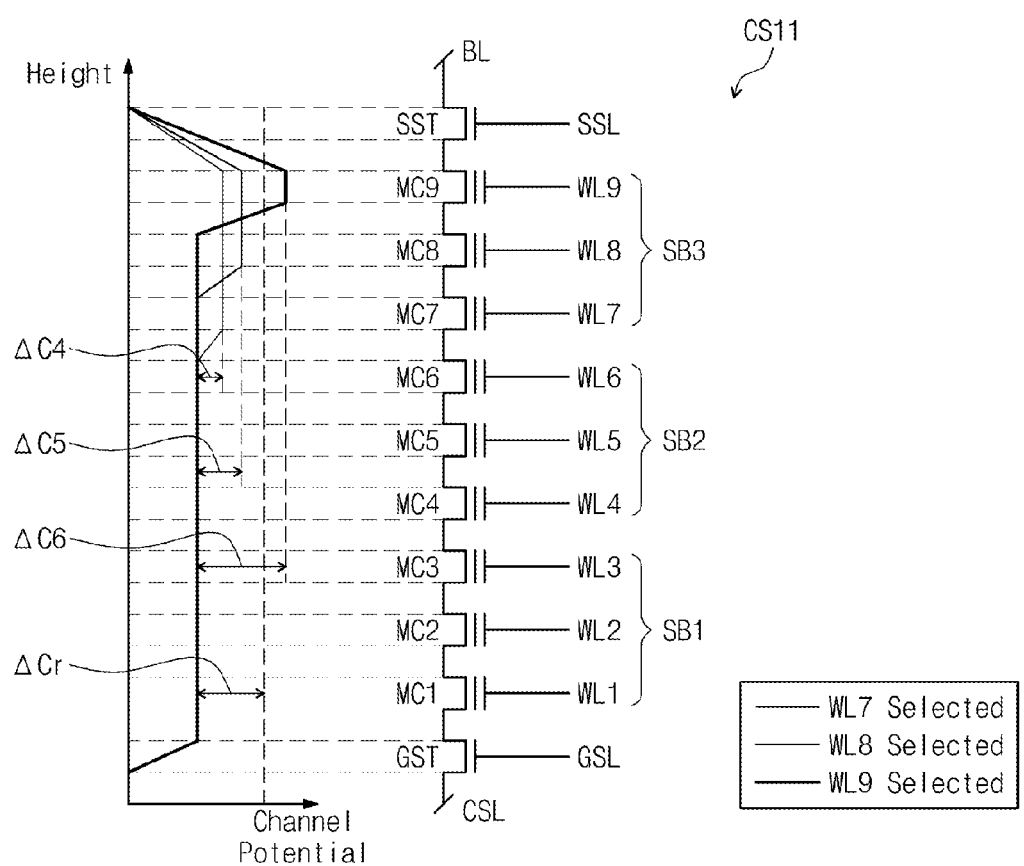
FIG. 14 is a drawing illustrating a channel voltage of one unselect cell string in the memory block of FIG. 13.

FIG. 13 is a drawing illustrating the memory block of FIG. 3 according to another embodiment of the inventive concept. FIG. 14 is a drawing illustrating a channel voltage of one unselect cell string in the memory block of FIG. 13. In the graph of FIG. 13, a horizontal axis represents a voltage of a channel and a vertical axis represents a height of memory cells.

Referring to FIGS. 13 and 14, it is assumed that memory cells included in a first sub block SB1 and a second sub block SB2 have a program state P and memory cells included in a third sub block SB3 have an erase state E.

First through third memory cells MC1~MC3 connected to first through third word lines WL1~WL3 are included in the first sub block SB1. Fourth through sixth memory cells MC4~MC6 connected to fourth through sixth word lines WL4~WL6 are included in the second sub block SB2. Seventh through ninth memory cells MC7~MC9 connected to seventh through ninth word lines WL7~WL9 are included in the third sub block SB3.

In a program operation, a string select transistor SST and a ground select transistor GST of an unselect cell string CS11 maintain a turn-off state. Channels of memory cells MC1~MC9 are floated.

A precharge condition may be that a selected word line is connected to a sub block SB3 of an erase state disposed last in a program order DR1 and corresponds to the third reference number in inverse order of a program order DR1 among the word lines WL7~WL9 connected to the sub block SB3 of an erase state. The third reference number is one or more predetermined values and may be the number of select memory cells of which a channel voltage difference is greater than the allowable channel voltage difference as compared with unselect memory cells in one cell string. The allowable channel voltage difference means a channel voltage difference that does not cause a program disturbance between a channel select memory cell and an unselect memory cell.

In the case where a channel voltage difference between the select memory cell MC9 and the unselect memory cells MC1~MC8 is greater than the allowable channel voltage difference $\Delta Cr$, a program voltage being applied to the selected word line WL9 connected to the select memory cell MC9 is applied before a pass voltage.

A program operation of the third sub block SB3 may be performed by sequentially selecting the word lines WL7~WL9. Referring to FIGS. 13 and 14, the first reference number is one as an illustration. A program voltage being applied to the ninth word line WL9 connected to the ninth memory cell MC9 which is connected to the third sub block SB3 and programmed at the end may be applied before the pass voltage. A program voltage being applied to the seventh and eighth word lines WL7 and WL8 connected to the seventh and eighth memory cells MC7 and MC8 may not be applied before the pass voltage.

If the program operation starts with respect to the third sub block SB3, the word line WL7 is selected and a program voltage is applied to the selected word line WL7. The pass voltage is applied to the unselected word lines WL1~WL6 and WL8~WL9. A channel voltage of the memory cells MC1~MC9 may be boosted by the pass voltage and the program voltage to increase. A threshold voltage of the memory cells MC1~MC6 of a program state P is higher than that of the memory cells MC7~MC9 of an erase state E. Accordingly, a channel voltage of the memory cells MC7~MC9 is higher than a channel voltage of the memory cells MC1~MC6.

In the case where the seventh word line WL7 is the selected word line WL7, the memory cells MC7~MC9 and the memory cells MC1~MC6 have a fourth channel voltage difference $\Delta C4$. The fourth channel voltage difference $\Delta C4$ may be smaller than the allowable channel voltage difference $\Delta Cr$. The allowable channel voltage difference $\Delta Cr$ means a difference between a channel voltage of memory cells of a program state in which a program disturbance does not occur and a channel voltage of memory cells of an erase state.

After the seventh memory cell MC7 is converted into a program state, the word line WL8 is selected and a program voltage is applied to the selected word line WL8. A pass voltage is applied to the unselected word lines WL1~WL7 and WL9. The memory cell MC7 is converted into a program state and thereby the number of memory cells MC8 and MC9 of an erase state E is reduced. A channel boosting efficiency of the memory cells MC8 and MC9 of an erase state E increases.

In the case where the eighth word line WL8 is a selected word line WL8, a difference between the memory cells MC8 and MC9 and the memory cells MC1~MC7 is a fifth channel voltage difference $\Delta C5$. The fifth channel voltage difference $\Delta C5$ may be smaller than the allowable channel voltage difference $\Delta Cr$.

After the eighth memory MC8 is converted into a program state, the word line WL9 is selected and a program voltage is applied to the selected word line WL9. A pass voltage is applied to the unselected word lines WL1~WL8.

The memory cell MC8 is converted into a program state and thereby the number of memory cells MC9 of an erase state E is reduced. A channel boosting efficiency of the memory cells MC9 of an erase state E increases.

In the case where the ninth word line WL9 is a selected word line WL9, a difference between the select memory cell MC9 and the unselect memory cells MC1~MC8 is a sixth channel voltage difference $\Delta C6$. The sixth channel voltage difference $\Delta C6$ may be greater than the allowable channel voltage difference $\Delta Cr$.

In the case where the sixth channel voltage difference $\Delta C6$ may be greater than the allowable channel voltage difference $\Delta Cr$, thermal electrons may be generated between the select memory cell MC9 and the unselect memory cells MC8 adjacent to the select memory cell MC6 or between the select memory cell MC9 and the string select transistor SST. The generated thermal electrons may be trapped in the select memory cell MC9 and may cause a threshold voltage change of the select memory cell MC9. That is, in the case that the sixth channel voltage difference $\Delta C6$ is greater than the allowable channel voltage difference $\Delta Cr$, a program disturbance may occur.

In the case where a selected word line satisfies a precharge condition, a program disturbance in a select memory cell of the unselected memory cell may be eased by applying a program voltage being applied to the selected word line before a pass voltage being applied to the unselected word lines.

Figure 15:
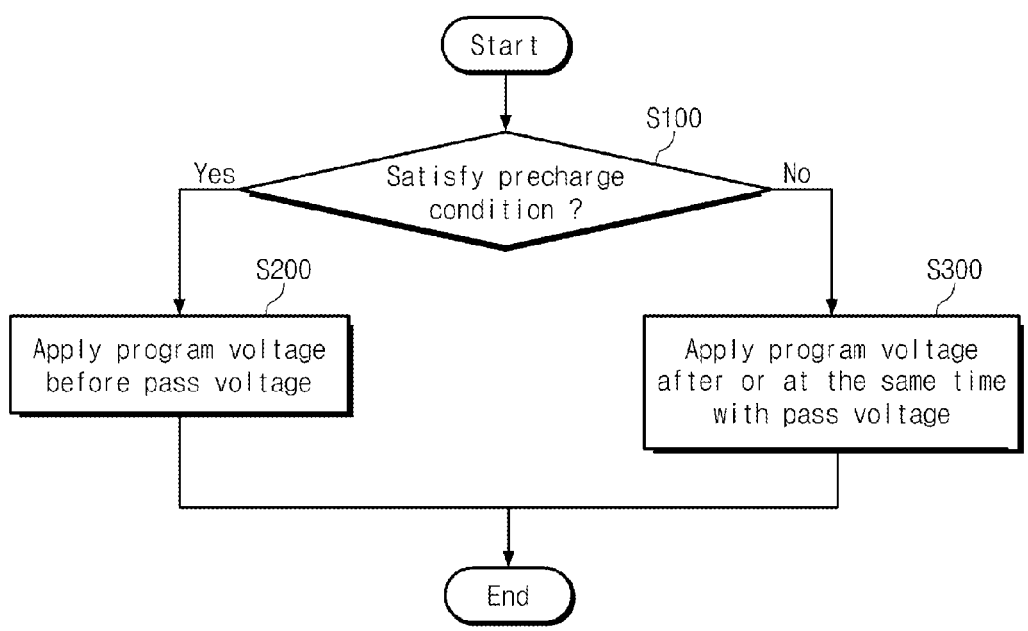
FIG. 15 is a flow chart illustrating a program method of a nonvolatile memory device according to some embodiments of the inventive concept.

FIG. 15 is a flow chart illustrating a program method of a nonvolatile memory device according to some embodiments of the inventive concept. Referring to FIG. 15, it is determined whether a selected word line satisfies a precharge condition.

The precharge condition may be that the maximum level of a program voltage being applied to the selected word line is greater than the predetermined allowable level.

The precharge condition may be that a program voltage being applied to the selected word line corresponds to a program loop within a first reference number in inverse order of a program loop proceeding order among one program step defined by a plurality of program loops.

The precharge condition may be that the selected word line is connected to a sub block of an erase state disposed between sub blocks of a program state and corresponds to a second reference number in inverse order of a program order among word lines connected to the sub blocks of the erase state.

The precharge condition may be that the selected word line is connected to a sub block of an erase state disposed last in a program order direction and corresponds to a third reference number in inverse order of a program order among word lines connected to the sub blocks of the erase state.

In the case where the selected word line satisfies the precharge condition, a program voltage being applied to the selected word line is applied before a pass voltage being applied to an unselected word line (S200).

In the case where the selected word line does not satisfy the precharge condition, the program voltage being applied to the selected word line is applied in concurrence with or after the pass voltage being applied to an unselected word line (S300).

Figure 16:
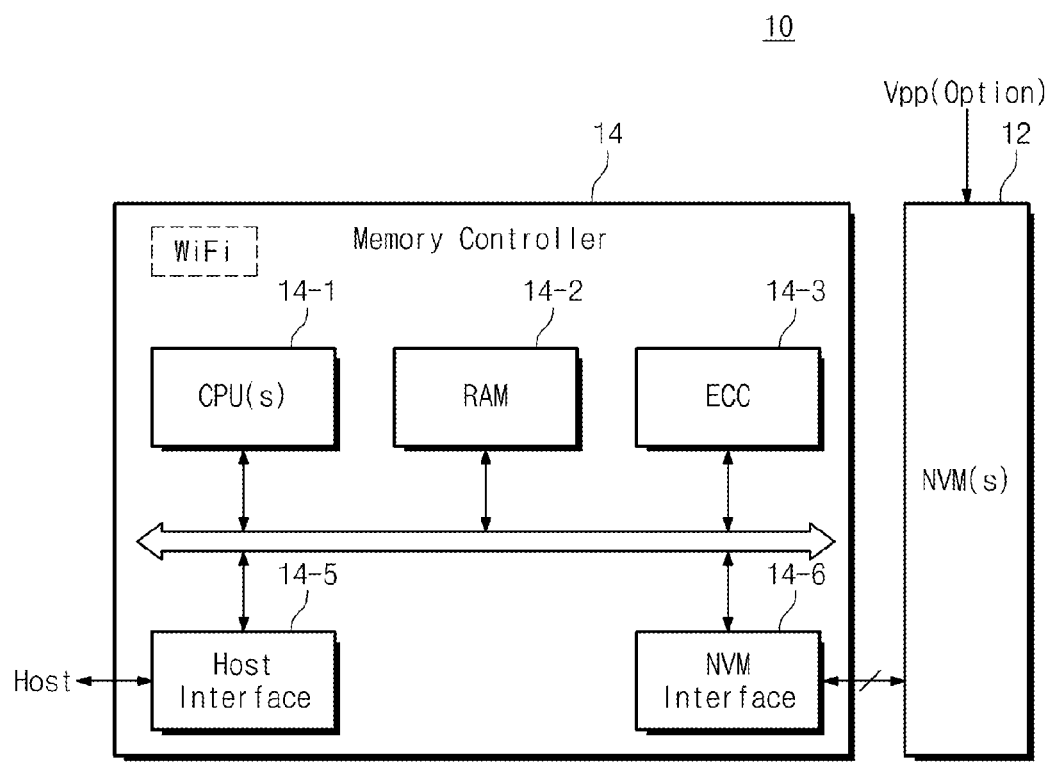
FIG. 16 is a block diagram illustrating a storage device according to some embodiments of the inventive concept.

FIG. 16 is a block diagram illustrating a storage device according to some embodiments of the inventive concept. Referring to FIG. 16, a storage device 10 includes at least one nonvolatile memory device 12 and a memory controller 14 controlling the nonvolatile memory device 12. The storage device 10 may be a storage medium like a memory card (CF, SD, microSD), a USB storage device, etc.

The nonvolatile memory device 12 may be embodied by the nonvolatile memory device 100 described in FIGS. 1 through 14.

The memory controller 14 controls read, write and erase operations with respect to the nonvolatile memory device 12. The memory controller 14 includes at least one central processing unit 14-1, a buffer memory (RAM) 14-2, an error correction circuit (ECC) 14-3, a host interface 14-5 and an NVM interface 14-6.

The central processing unit 14-1 can control an overall operation (for example, read and write operations, a file system management, a bad page management, etc.) of the nonvolatile memory device 12. The RAM 14-2 operates according to a control of the central processing unit 14-1 and may be used as an operation or working memory, a buffer memory, a cache memory, etc. In the case that the RAM 14-2 is used as a working memory, data being processed by the central processing unit 14-1 is temporarily stored. In the case that the RAM 14-2 is used as a buffer memory, it is used to buffer data to be transferred from a host to the nonvolatile memory device 12 or from the nonvolatile memory device 12 to the host. In the case that the RAM 14-2 is used as a cache memory, it makes the nonvolatile memory device 12 of a low speed operate at high speed.

The ECC circuit 14-3 generates an error correction code (ECC) for correcting a fail bit or an error bit of data received from the nonvolatile memory device 12. The ECC circuit 14-3 performs an error correction encoding of data being provided to the nonvolatile memory device 12 to form data to which a parity bit is added. The parity bit can be stored in the nonvolatile memory device 12. The ECC circuit 14-3 can perform an error correction decoding on data output from the nonvolatile memory device 12. The ECC circuit 14-3 can correct an error using the parity bit. The ECC circuit 14-3 can correct an error using a coded modulation such as a LDPC (low density parity check), a BCH code, a turbo code, a Reed-Solomon code, a convolution code, a RSC (recursive systematic code), a TCM (trellis-coded modulation), a BCM (block coded modulation), etc.

The memory controller 14 exchanges data with the host through the host interface 14-5 and exchanges data with the nonvolatile memory device 12 through the NVM interface 14-6. The host interface 14-5 can be connected to the host through a PATA (parallel AT attachment) bus, a SATA (serial AT attachment) bus, a SCSI, a USB, a PCIe, a NAND interface, etc.

The memory controller 14 can have a wireless communication function (for example, WiFi).

Figure 17:
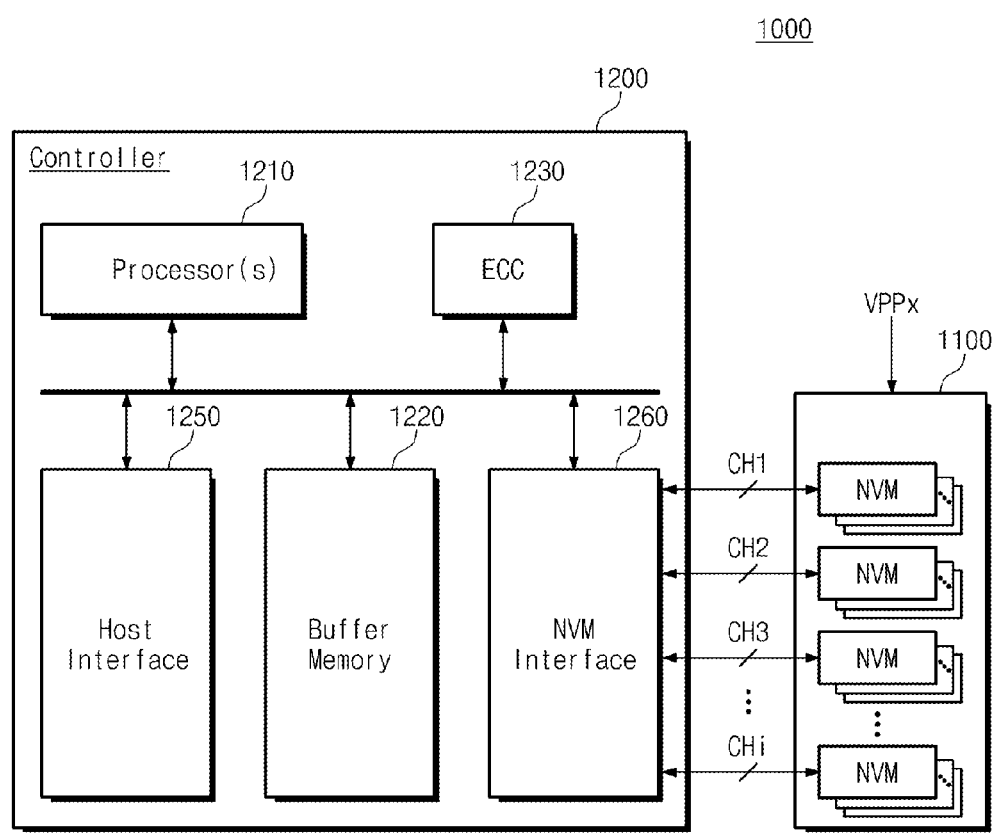
FIG. 17 is a block diagram illustrating an SSD (solid state drive) according to some embodiments of the inventive concept.

The inventive concept can be applied to an SSD (solid state drive). FIG. 17 is a block diagram illustrating a SSD (solid state drive) according to some embodiments of the inventive concept. Referring to FIG. 17, a SSD 1000 includes a plurality of nonvolatile memory devices 1100 and an SSD controller 1200.

The nonvolatile memory devices 1100 may be embodied to optionally receive an external high voltage VPPx. In the case where a selected word line satisfies a precharge condition, each nonvolatile memory device 1100, as described in FIGS. 1 through 14, may be embodied to apply a program voltage being applied to a selected word line before a pass voltage being applied to an unselected word line.

The SSD controller 1200 is connected to the nonvolatile memory devices 1100 through a plurality of channels CH1~CHi (i is an integer of 2 or more). The SSD controller 1200 includes at least one processor 1210, a buffer memory 1220, an error correction circuit 1230, a host interface 1250, and a nonvolatile memory interface 1260.

The buffer memory 1220 temporarily stores data needed to drive the memory controller 1200. The buffer memory 1220 may include a plurality of memory lines storing data or a command. The memory lines can be mapped into cache lines in various manners. The error correction circuit 1230 can calculate an error correction code value of data to be programmed in a write operation, correct an error of data read in a read operation on the basis of the error correction code value, and correct an error of data restored from the nonvolatile memory device 1100 in a data restoration operation. Although not illustrated, a code memory storing code data needed to drive the memory controller 1200 may be further included. The code memory may be embodied by a nonvolatile memory device.

The host interface 1250 can provide an interface function with an external device. The host interface 1250 may be a NAND flash interface. Besides, the host interface 1250 may be embodied by various types of interfaces and a plurality of interfaces. The nonvolatile memory interface 1260 may provide an interface function with the nonvolatile memory device 1100.

In the case where the selected word line satisfies the precharge condition, the SSD 1000 can apply the program voltage being applied to the selected word line before the pass voltage being applied to the unselected word lines to ease a program disturbance in a select memory cell of an unselect string.

Figure 18:
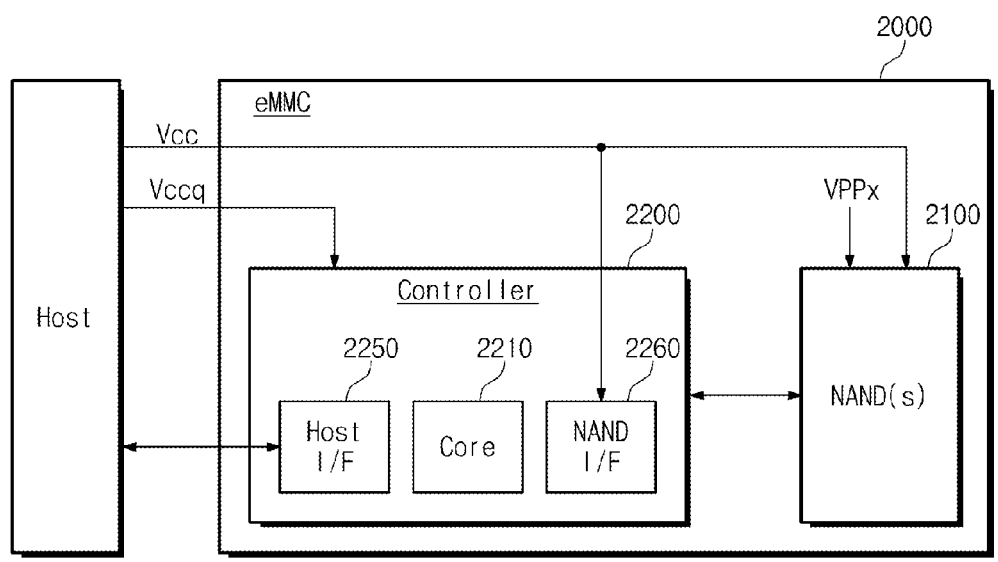
FIG. 18 is a block diagram illustrating an eMMC according to some embodiments of the inventive concept.

The inventive concept may be applied to an eMMC (embedded multimedia card, moviNAND, iNAND). FIG. 18 is a block diagram illustrating an eMMC according to some embodiments of the inventive concept. Referring to FIG. 18, the eMMC 2000 may include at least one NAND flash memory device 2100 and a controller 2200.

In the case where a selected word line satisfies a precharge condition, each nonvolatile memory device 1100, as described in FIGS. 1 through 14, may be embodied to apply a program voltage being applied to a selected word line before a pass voltage being applied to an unselected word line. The memory controller 2200 is connected to the NAND flash memory device 2100 through a plurality of channels. The controller 2200 includes at least one control core 2210, a host interface 2250, and a NAND interface 2260. The control core 2210 controls an overall operation of the eMMC 2000. The host interface 2250 performs an interface between the control core 2210 and a host. The NAND interface 2260 performs an interface between the NAND flash memory device 2100 and the controller 2200. The host interface 2250 may be a parallel interface (for example, an MMC interface). The host interface 2250 of the eMMC 2000 may be a serial interface (for example, UHS-II, UFS interface). The host interface 2250 may be a NAND interface.

The eMMC 2000 is provided with power supply voltages Vcc and Vccq from the host. A first power supply voltage Vcc (for example, 3.3V) is provided to the NAND flash memory device 2100 and the NAND interface 1230. A second power supply voltage Vccq (for example, 1.8V/3.3V) is provided to the controller 2200. The eMMC 2000 may optionally be provided with an external high voltage VPPx.

Figure 19:
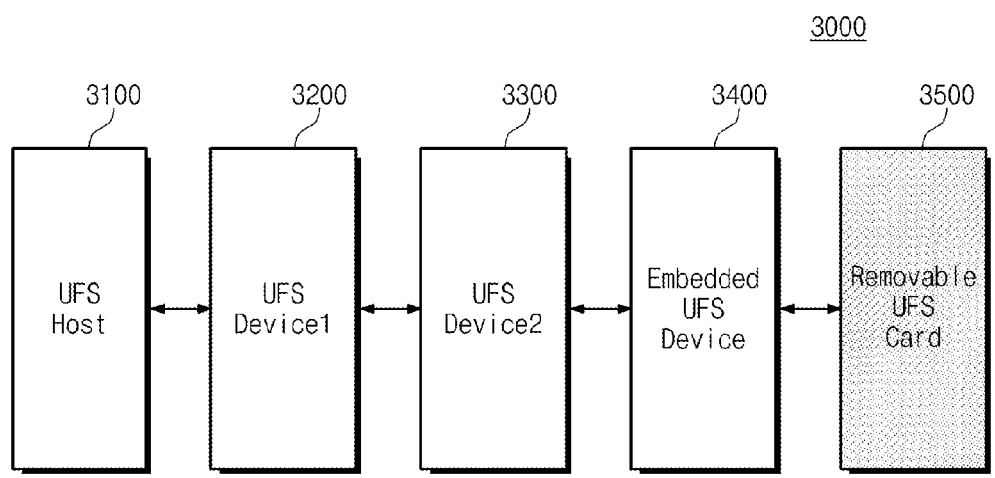
FIG. 19 is a block diagram illustrating a UFS system according to some embodiments of the inventive concept.

The inventive concept can be applied to a UFS (universal flash storage). FIG. 19 is a block diagram illustrating a UFS system according to some embodiments of the inventive concept. Referring to FIG. 19, a UFS system 3000 may include a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 can communicate with external devices by a UFS protocol. At least one of the UFS devices 3200 and 3300, the embedded UFS device 3400, and the removable UFS card 3500 can be embodied by the storage device 10 illustrated in FIG. 16.

The embedded UFS device 3400 and the removable UFS card 3500 can communicate by different protocols from the UFS protocol. The UFS host 3100 and the removable UFS card 3500 can communicate by various types of card protocols (for example, UFDs, MMC, SD (secure digital), mini SD, micro SD, etc.).

Figure 20:
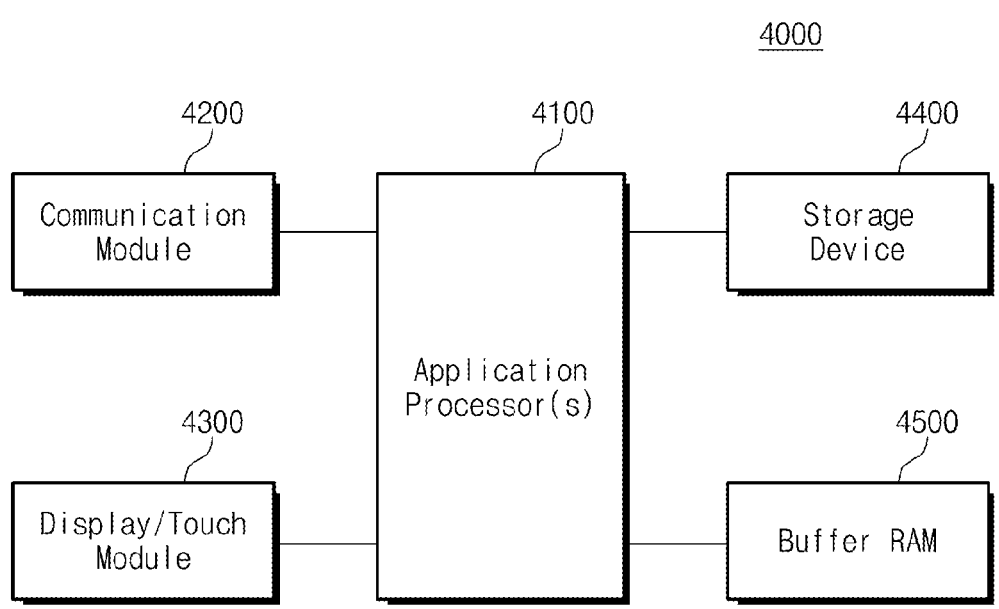
FIG. 20 is a block diagram illustrating a mobile device according to some embodiments of the inventive concept.

The inventive concept can be applied to a mobile device. FIG. 20 is a block diagram illustrating a mobile device according to some embodiments of the inventive concept. Referring to FIG. 20, a mobile device 4000 includes an application processor 4100, a communication module 4200, a display/touch module 4300, a storage device 4400, and a mobile RAM 4500.

The application processor 4100 controls an overall operation of the mobile device 4000. The communication module 4200 may be embodied to control a wired/wireless communication with the outside. The display/touch module 4300 may be embodied to display data processed in the application processor 4100 or receive data from a touch panel. The storage device 4400 may be embodied to store data of a user. The storage device 4400 may be an eMMC, an SSD and a UFS device. In the case that a selected word line satisfies a precharge condition, the storage device 4400, as described in FIGS. 1 through 14, may be embodied to apply a program voltage being applied to a selected word line before a pass voltage being applied to an unselected word line. The mobile RAM 4500 may be embodied to temporarily store data needed to process the mobile device 4000.

The mobile device 4000 can improve system performance by including the storage device 4400 preventing a threshold voltage distribution from being disturbed.

The memory system or the storage device can be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to a nonvolatile memory device and a method of programming the same, a program disturbance in a select memory cell of an unselect string may be eased, reduced or eliminated.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A method of programming a nonvolatile memory device including a plurality of memory blocks including a plurality of cell strings, each cell string including a plurality of memory cells stacked in a direction perpendicular to a substrate and coupled to word lines, the method comprising:
applying a program voltage to a selected word line and a pass voltage to an unselected word line in a same program loop to program a memory cell connected to the selected word line,
wherein application of the program voltage to the selected word line is started before a start of application of the pass voltage to the unselected word line when the selected word line satisfies a precharge condition,
wherein the memory blocks include a plurality of sub blocks, and wherein the precharge condition is satisfied when the selected word line is connected to a sub block from among the plurality of sub blocks that is in an erase state and that is between sub blocks from among the plurality of sub blocks that are in a program state and corresponds to a reference number in inverse order of a program order among word lines connected to sub blocks from among the plurality of sub blocks that are in the erase state.

2. The method of programming of claim 1, wherein application of the program voltage to the selected word line is started in concurrence with or after the start of application of the pass voltage to the unselected word line when the selected word line does not satisfy the precharge condition.

3. The method of programming of claim 2, wherein applying the program voltage comprises:
applying a first program voltage to the selected word line;
applying a second program voltage to the selected word line after the first program voltage is applied to the selected word line; and
applying the pass voltage to the unselected word line after the first program voltage is applied to the selected word line.

4. The method of programming of claim 3, wherein the first program voltage is applied within a bit line setup period, and wherein the pass voltage is applied after the bit line setup period.

5. The method of programming of claim 3, wherein a voltage level of the first program voltage is lower than a voltage level of the pass voltage.

6. The method of programming of claim 3, wherein a voltage level of the first program voltage is proportional to a voltage level of the second program voltage.

7. The method of programming of claim 3, wherein a period during which the first program voltage is applied is proportional to a voltage level of the first program voltage.

8. A method of programming a nonvolatile memory device including a plurality of memory blocks including a plurality of cell strings, each cell string including a plurality of memory cells coupled to word lines, the method comprising:
selecting a word line to have a program voltage applied thereto; and
applying a program voltage to a selected word line and a pass voltage to an unselected word line in a same program loop to program a memory cell connected to the selected word line,
wherein application of the program voltage to the selected word line is started before a start of application of the pass voltage to the unselected word line when the selected word line satisfies a precharge condition, and
wherein application of the program voltage to the selected word line is started in concurrence with or after the start of application of the pass voltage to the unselected word line when the selected word line does not satisfy the precharge condition, wherein the memory blocks include a plurality of sub blocks, and wherein the precharge condition is satisfied when the selected word line is connected to a sub block from among the plurality of sub blocks that is in an erase state and that is last in a program order direction and corresponds to a reference number in inverse order of a program order among the word lines connected to sub blocks from among the plurality of sub blocks that are in the erase state.

9. The method of programming of claim 8, wherein applying the program voltage to the selected word line before the pass voltage is applied to the unselected word line comprises:
   applying a first program voltage to the selected word line;
   applying a second program voltage to the selected word line after the first program voltage is applied to the selected word line; and
   applying the pass voltage to the unselected word line after the first program voltage is applied to the selected word line.

10. The method of programming of claim 9, wherein the first program voltage is applied within a bit line setup period, and wherein the pass voltage is applied after the bit line setup period.

11. The method of programming of claim 9, wherein a voltage level of the first program voltage is lower than a voltage level of the pass voltage.

12. A nonvolatile memory device comprising:
    a memory cell array comprising a plurality of memory blocks including a plurality of cell strings, each cell string among the plurality of cell strings including a plurality of memory cells stacked in a direction perpendicular to a substrate;
    an address decoder configured to select any of the memory blocks in response to an address;
    a read and write circuit configured to store data to be programmed in memory cells from among the plurality of memory cells connected to a selected word line among word lines of a selected memory block in a program operation; and
    a control logic configured to control operations so that application of a program voltage to the selected word line is started before application of a pass voltage to an unselected word line is started in a same program loop when the selected word line satisfies a precharge condition based on a level of the program voltage in the program operation,
    wherein the precharge condition is satisfied when the program voltage applied to the selected word line corresponds to a program loop within a first reference number in inverse order of a program loop proceeding order among a program step defined by a plurality of program loops.

13. The nonvolatile memory device of claim 12, wherein the control logic is configured to control operations so that application of the program voltage to the selected word line is started in concurrence with or after a start of application of the pass voltage to the unselected word line when the selected word line does not satisfy the precharge condition.

* * * * *